(12) United States Patent
Shoemaker et al.

(10) Patent No.: US 10,411,498 B2
(45) Date of Patent: Sep. 10, 2019

(54) APPARATUS AND METHODS FOR EXTENDING SENSOR INTEGRATED CIRCUIT OPERATION THROUGH A POWER DISTURBANCE

(71) Applicant: Allegro MicroSystems, LLC, Worcester, MA (US)

(72) Inventors: Eric G. Shoemaker, Windham, NH (US); P. Karl Scheller, Bow, NH (US); Devon Fernandez, Londonderry, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 253 days.

(21) Appl. No.: 15/269,097

(22) Filed: Sep. 19, 2016

(65) Prior Publication Data

US 2017/0117801 A1   Apr. 27, 2017

Related U.S. Application Data

(60) Provisional application No. 62/244,477, filed on Oct. 21, 2015.

(51) Int. Cl.
*H02J 7/34* (2006.01)
*H01L 23/495* (2006.01)
*G01D 11/00* (2006.01)

(52) U.S. Cl.
CPC ........ *H02J 7/345* (2013.01); *H01L 23/49589* (2013.01); *G01D 11/00* (2013.01)

(58) Field of Classification Search
CPC .............................................. H01L 23/49589
See application file for complete search history.

(56) References Cited

U.S. PATENT DOCUMENTS

| 4,409,608 | A | | 10/1983 | Yoder |
| 4,451,845 | A | * | 5/1984 | Philofsky .............. H01L 23/057 257/703 |
| 4,994,731 | A | | 2/1991 | Sanner |

(Continued)

FOREIGN PATENT DOCUMENTS

| DE | 4031560 | 4/1992 |
| JP | H01-207909 A | 8/1989 |

(Continued)

OTHER PUBLICATIONS

Office Action dated Oct. 19, 2010 for U.S. Appl. No. 12/198,191; 12 pages.

(Continued)

*Primary Examiner* — Rexford N Barnie
*Assistant Examiner* — David A Shiao
(74) *Attorney, Agent, or Firm* — Daly, Crowley, Mofford & Durkee, LLP

(57) ABSTRACT

A sensor integrated circuit includes an energy storage device having a first terminal coupled to a functional circuit and a blocking circuit coupled between a power supply pin and the first terminal of the energy storage device. The blocking circuit permits the energy storage device to store energy from an external power supply coupled to the power pin. The first terminal of the energy storage device is inaccessible from outside of the sensor IC. Additional features of the sensor IC can include a high regulator, a low regulator, and a low power circuit.

32 Claims, 8 Drawing Sheets

(56) References Cited

U.S. PATENT DOCUMENTS

| | | | |
|---|---|---|---|
| 5,244,634 A | 9/1993 | Suzuki et al. | |
| 5,399,905 A | 3/1995 | Honda et al. | |
| 5,414,355 A | 5/1995 | Davidson et al. | |
| 5,523,617 A * | 6/1996 | Asanasavest | H01L 21/485 257/666 |
| 5,539,241 A | 7/1996 | Abidi et al. | |
| 5,563,199 A | 10/1996 | Harada et al. | |
| 5,579,194 A | 11/1996 | MacKenzie et al. | |
| 5,581,179 A | 12/1996 | Engel et al. | |
| 5,648,682 A | 7/1997 | Nakazawa et al. | |
| 5,666,004 A | 9/1997 | Bhattacharyya et al. | |
| 5,691,869 A | 11/1997 | Engel et al. | |
| 5,714,405 A | 2/1998 | Tsubosaki et al. | |
| 5,726,577 A | 3/1998 | Engel et al. | |
| 5,729,130 A | 3/1998 | Moody et al. | |
| 5,804,880 A | 9/1998 | Mathew | |
| 5,822,849 A | 10/1998 | Casali et al. | |
| 5,912,556 A | 6/1999 | Frazee et al. | |
| 5,940,256 A | 8/1999 | MacKenzie et al. | |
| 5,973,388 A | 10/1999 | Chew et al. | |
| 6,057,997 A | 5/2000 | MacKenzie et al. | |
| 6,097,109 A | 8/2000 | Fendt et al. | |
| 6,178,514 B1 | 1/2001 | Wood | |
| 6,265,865 B1 | 7/2001 | Engel et al. | |
| 6,316,736 B1 | 11/2001 | Jairazbhoy et al. | |
| 6,359,331 B1 | 3/2002 | Rinehart et al. | |
| 6,396,712 B1 | 5/2002 | Kuijk | |
| 6,420,779 B1 | 7/2002 | Sharma et al. | |
| 6,424,018 B1 | 7/2002 | Ohtsuka | |
| 6,429,652 B1 | 8/2002 | Allen et al. | |
| 6,480,699 B1 | 11/2002 | Lovoi | |
| 6,486,535 B2 | 11/2002 | Liu | |
| 6,501,270 B1 | 12/2002 | Opie | |
| 6,504,366 B2 | 1/2003 | Bodin et al. | |
| 6,563,199 B2 | 5/2003 | Yasunaga et al. | |
| 6,608,375 B2 | 8/2003 | Terui et al. | |
| 6,610,923 B1 | 8/2003 | Nagashima et al. | |
| 6,617,846 B2 | 9/2003 | Hayat-Dawoodi et al. | |
| 6,642,609 B1 | 11/2003 | Minamio et al. | |
| 6,696,952 B2 | 2/2004 | Zirbes | |
| 6,713,836 B2 | 3/2004 | Liu et al. | |
| 6,737,298 B2 | 5/2004 | Shim et al. | |
| 6,747,300 B2 | 6/2004 | Nadd et al. | |
| 6,775,140 B2 | 8/2004 | Shim et al. | |
| 6,781,359 B2 | 8/2004 | Stauth et al. | |
| 6,798,057 B2 | 9/2004 | Bolkin et al. | |
| 6,809,416 B1 | 10/2004 | Sharma | |
| 6,812,687 B1 | 11/2004 | Ohtsuka | |
| 6,825,067 B2 | 11/2004 | Ararao et al. | |
| 6,832,420 B2 | 12/2004 | Liu | |
| 6,853,178 B2 | 2/2005 | Hayat-Dawoodi | |
| 6,861,283 B2 | 3/2005 | Sharma | |
| 6,875,634 B2 | 4/2005 | Shim et al. | |
| 6,903,447 B2 * | 6/2005 | Schmitz | H01L 23/3107 257/662 |
| 6,921,955 B2 | 7/2005 | Goto | |
| 6,960,493 B2 | 11/2005 | Ararco et al. | |
| 6,974,909 B2 | 12/2005 | Tanaka et al. | |
| 6,995,315 B2 | 2/2006 | Sharma et al. | |
| 7,005,325 B2 | 2/2006 | Chow et al. | |
| 7,026,808 B2 | 4/2006 | Vig et al. | |
| 7,075,287 B1 | 7/2006 | Mangtani et al. | |
| 7,166,807 B2 | 1/2007 | Gagnon et al. | |
| 7,259,624 B2 | 8/2007 | Barnett | |
| 7,265,531 B2 | 9/2007 | Stauth et al. | |
| 7,304,370 B2 | 12/2007 | Imaizumi et al. | |
| 7,358,724 B2 | 4/2008 | Taylor et al. | |
| 7,369,969 B2 | 5/2008 | Scherr | |
| 7,378,721 B2 | 5/2008 | Frazee et al. | |
| 7,378,733 B1 | 5/2008 | Hoang et al. | |
| 7,476,816 B2 | 1/2009 | Doogue et al. | |
| 7,476,953 B2 | 1/2009 | Taylor et al. | |
| 7,518,493 B2 | 4/2009 | Bryzek et al. | |
| 7,573,112 B2 | 8/2009 | Taylor | |
| 7,676,914 B2 | 3/2010 | Taylor | |
| 7,687,882 B2 | 3/2010 | Taylor et al. | |
| 7,696,006 B1 | 4/2010 | Hoang et al. | |
| 7,768,083 B2 | 8/2010 | Doogue et al. | |
| 7,777,607 B2 | 8/2010 | Taylor et al. | |
| 8,008,908 B2 | 8/2011 | Doogue et al. | |
| 8,093,670 B2 | 1/2012 | Taylor | |
| 8,138,750 B2 | 3/2012 | Fink et al. | |
| 8,222,888 B2 | 7/2012 | David et al. | |
| 9,228,860 B2 | 1/2016 | Sharma et al. | |
| 9,411,025 B2 | 8/2016 | David et al. | |
| 9,494,660 B2 | 11/2016 | David et al. | |
| 2001/0052780 A1 | 12/2001 | Hayat-Dawoodi | |
| 2002/0005780 A1 | 1/2002 | Ehrlich et al. | |
| 2002/0027488 A1 | 3/2002 | Hayat-Dawoodi et al. | |
| 2002/0195693 A1 | 12/2002 | Liu et al. | |
| 2003/0038464 A1 | 2/2003 | Furui | |
| 2003/0209784 A1 | 11/2003 | Schmitz et al. | |
| 2004/0094826 A1 | 5/2004 | Yang et al. | |
| 2004/0135220 A1 | 7/2004 | Goto | |
| 2004/0135574 A1 | 7/2004 | Hagio et al. | |
| 2004/0174655 A1 | 9/2004 | Tsai et al. | |
| 2004/0207035 A1 | 10/2004 | Witcraft et al. | |
| 2004/0207077 A1 | 10/2004 | Leal et al. | |
| 2004/0207400 A1 | 10/2004 | Witcraft et al. | |
| 2004/0262718 A1 | 12/2004 | Ramakrishna | |
| 2005/0035448 A1 | 2/2005 | Hsu et al. | |
| 2005/0151448 A1 | 7/2005 | Hikida et al. | |
| 2005/0173783 A1 | 8/2005 | Chow et al. | |
| 2005/0219796 A1 | 10/2005 | Narendra et al. | |
| 2005/0224248 A1 | 10/2005 | Gagnon et al. | |
| 2005/0248005 A1 | 11/2005 | Hayat-Dawoodi | |
| 2005/0253507 A1 | 11/2005 | Fujimura et al. | |
| 2005/0270748 A1 | 12/2005 | Hsu | |
| 2005/0274982 A1 | 12/2005 | Ueda et al. | |
| 2006/0038289 A1 | 2/2006 | Hsu et al. | |
| 2006/0077598 A1 | 4/2006 | Taylor et al. | |
| 2006/0175674 A1 | 8/2006 | Taylor et al. | |
| 2006/0181263 A1 | 8/2006 | Doogue et al. | |
| 2006/0219436 A1 | 10/2006 | Taylor et al. | |
| 2006/0267135 A1 | 11/2006 | Wolfgang et al. | |
| 2007/0007631 A1 | 1/2007 | Knittl | |
| 2007/0018642 A1 | 1/2007 | Ao | |
| 2007/0138651 A1 | 6/2007 | Hauenstein | |
| 2007/0170533 A1 | 7/2007 | Doogue et al. | |
| 2007/0241423 A1 | 10/2007 | Taylor et al. | |
| 2008/0013298 A1 * | 1/2008 | Sharma | G01D 11/245 361/813 |
| 2008/0018261 A1 | 1/2008 | Kastner | |
| 2008/0034582 A1 | 2/2008 | Taylor | |
| 2008/0036453 A1 | 2/2008 | Taylor | |
| 2010/0019332 A1 | 1/2010 | Taylor | |
| 2010/0052052 A1 * | 3/2010 | Lotfi | H01L 21/28518 257/336 |
| 2010/0052125 A1 * | 3/2010 | Sasaki | B23K 20/005 257/676 |
| 2010/0052424 A1 * | 3/2010 | Taylor | H01L 23/5223 307/45 |
| 2013/0106174 A1 * | 5/2013 | Uchida | F02N 11/0866 307/9.1 |
| 2013/0176012 A1 | 7/2013 | Eagen et al. | |
| 2013/0249027 A1 | 9/2013 | Taylor et al. | |
| 2013/0249029 A1 | 9/2013 | Vig et al. | |
| 2013/0249544 A1 | 9/2013 | Vig et al. | |
| 2015/0200162 A1 * | 7/2015 | Constantino | H01L 23/66 257/532 |
| 2015/0285874 A1 | 10/2015 | Taylor et al. | |

FOREIGN PATENT DOCUMENTS

| | | |
|---|---|---|
| JP | 9-79865 | 3/1997 |
| JP | H11-326354 | 11/1999 |
| JP | 2000-14047 | 1/2000 |
| JP | 2000-260939 | 9/2000 |
| TW | 535274 | 6/2003 |
| WO | WO 00-13438 | 3/2000 |
| WO | WO 0054068 | 9/2000 |
| WO | WO 0069045 | 11/2000 |

(56) References Cited

FOREIGN PATENT DOCUMENTS

| WO | WO 01-74139 | 10/2001 |
|----|----|----|
| WO | WO 2005/013363 | 2/2005 |
| WO | WO 2007-120697 | 10/2007 |

OTHER PUBLICATIONS

Amendment dated Feb. 18, 2011 for U.S. Appl. No. 12/198,191; 26 pages.
Office Action dated Mar. 17, 2011 for U.S. Appl. No. 12/198,191; 14 pages.
Notice of Appeal dated Aug. 15, 2011 for U.S. Appl. No. 12/198,191; 1 page.
Appeal Brief dated Oct. 28, 2011 for U.S. Appl. No. 12/198,191; 17 pages.
Examiner's Answer to Appeal brief dated Dec. 19, 2011 for U.S. Appl. No. 17 pages.
Reply brief filed Jan. 9, 2012 for U.S. Appl. No. 12/198,191; 14 pages.
Decision on Appeal dated Sep. 22, 2014 for U.S. Appl. No. 12/198,191; 6 pages.
Search Report and the Written Opinion dated Jun. 2, 2010 for PCT Application No. PCT/US2009/054254; 24 pages.
International Preliminary Report on patentability dated Mar. 10, 2011 for PCT Application No. PCT/US2009/054254; 14 pages.
Invitation to Pay Additional Fees and Partial Search Report dated Jan. 11, 2010 for PCT Application No. PCT/US2009/054254; 8 pages.
English translation of Japanese Office Action dated Jan. 4, 2013 for Japanese Application No. 2011-525094; 3 pages.
Response to Japanese Office Action filed Apr. 25, 2013 and letter from Yuasa and Hara dated Dec. 9, 2013 for Japanese Application No. 2011-525094; 6 pages.
Japanese Notice of Allowance and letter from Yuasa and Hara dated Feb. 5, 2014 for Japanese Application No. 2011-525094; 4 pages.
Chinese Office Action with English translation dated Oct. 29, 2012 for Chinese Application No. 200980133460.9; 22 pages.
Response to Chinese Office Action dated Mar. 13, 2013 for Chinese Application No. 200980133460.9; 9 pages.
Chinese Office Action with English translation dated Jul. 8, 2013 for Chinese Application No. 200980133460.9; 12 pages.
Response to Chinese Office Action filed Sep. 23, 2013 for Chinese Application No. 200980133460.9; 4 pages.
Chinese Notice of Allowance with English translation dated Jan. 27, 2014 for Chinese Application No. 200980133460.9; 4 pages.
Infineon Technologies Datasheet TLE4942-1, TLE4942-1C "Differential Two-Wire Hall Effect Sensor-lC for Wheel Speed Applications with Direction Detection", vol. 3.1., Feb. 2005, 32 pages.
Infineon Technologies Datasheet TLE4980C "Smart Hall Effect Sensor for Camshaft Applications", 2003, Infineon Technologies AG, Germany, 2 pages.
Allegro Datasheet ATS616LSG "Dynamic Self-Calibrating Peak-Detecting Differential Hall Effect Gear Tooth Sensor", 2005, 14 pages.
Allegro Datasheet ATS616LSG Dynamic Self-Calibrating Peak-Detecting Differential Hall Effect Gear Tooth Sensor, Mar. 22, 2006, 2 pages.
Allegro Microsystems, Inc., Hall-Effect IC Applications Guide, 36 pages.
Allegro Datasheet A1642LK "Two-Wire True Zero-Speed Miniature Differential Peak-Detecting Sensor with Continuous Calibration", 13 pages.
Allegro Microsystems, Inc., Two-Wire True Zero-Speed Miniature Differential Peak-Detecting Sensor with Continuous Calibration, Data Sheet, Mar. 22, 2006, 2 pages.
Mario Motz et al. "A Chopped Hall Sensor With Small Jitter and Programmable "True Power-On" Function", IEEE Journal of Solid-State Circuits, vol. 40, No. 7, Jul. 2005, 8 pages.
Scandius Biomedical; "TriTis Tibial Fixation System and Implant" Brochure from Scandlus BioMedical, Inc. website http://www.scandius.com/documents/TriTisSSheetPlum3.pdf; Jan. 1, 2006, 2 pages.
Hashemi "The Close Attached Capacitor: A Solution to Switching Noise Problems", IEEE Transactions on Components, Hybrids, and Manufacturing Technology, IEEE Inc. New York, US, vol. 15, No. 6, Dec. 1, 1992, pp. 1056-1063, XP000364765, ISSN: 0148-6411.
Wibben J, et al., "A High-Efficiency DC-DC Converter Using 2 nH Integrated Inductors", IEEE Journal of Solid-State Circuits, IEEE Service Center, Piscataway, NJ, vol. 43, No. 4, Apr. 1, 2008, pp. 844-854, XP011206706, ISSN: 0018-9200.
Notification of transmittal of the International Search Report and the Written Opinion dated Oct. 23, 2007 for PCT Application No. PCT/US2007/008920; 12 pages.
Second and Supplementary Notice Information the Applicant of the Communication of the International Application dated Aug. 14, 2008 for PCT Application No. PCT/US2007/008920; 1 page.
Notification Concerning Transmittal of international Preliminary Report on Patentability dated Oct. 23, 2008 for PCT Application No. PCT/US2007/008920; 7 pages.
Notification Concerning Transmittal of International Preliminary Report on Patentability dated Jan. 22, 2009 for PCT Application No. PCT/US2007/013358, 7 pages.
Notification of transmittal of the International Search Report and the Written Opinion dated Feb. 28, 2008 for PCT Application No. PCT/U52007/013358; 13 pages.
U.S. Appl. No. 11/554,619.
U.S. Appl. No. 11/877,144.
U.S. Appl. No. 11/877,100.
U.S. Appl. No. 12/178,781.
U.S. Appl. No. 11/279,780.

* cited by examiner

APPARATUS AND METHODS FOR EXTENDING SENSOR INTEGRATED CIRCUIT OPERATION THROUGH A POWER DISTURBANCE

CROSS REFERENCE TO RELATED APPLICATIONS

This application claims the benefit under 35 U.S.C. § 119(e) of U.S. Provisional Application No. 62/244,477 filed Oct. 21, 2015 and entitled "Apparatus and Methods for Extending Sensor Integrated Circuit Operation through a Power Disturbance", which application is incorporated herein by reference in its entirety.

STATEMENT REGARDING FEDERALLY SPONSORED RESEARCH

Not Applicable.

FIELD

This disclosure relates generally to sensor integrated circuits and, more particularly, to apparatus and methods to extend sensor operation through a power disturbance.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of an object, such as a ferromagnetic object in the form of a gear or ring magnet, or to sense a current, as examples.

Sensors are often provided in the form of an integrated circuit (IC) containing one or more semiconductor die supporting the sensor electronic circuitry (referred to herein also as functional circuit(s)) and optionally also containing additional elements, such as a magnet and/or passive components, such as capacitors, inductors, or resistors.

Power can be supplied to sensor integrated circuits through one or more pins from an external supply, such as from a car battery. The sensor output signal(s) are sometimes provided through one or more dedicated output pins. Alternatively, some sensors encode an output in the form of a current signal on the power and ground connections. Such sensors are sometimes referred to as "two-wire" devices and advantageously have fewer pins.

Power from the external power supply can experience various disturbances that can adversely impact a sensor's ability to provide accurate output information. Power disturbances include, for example, interruptions and transients due to intermittent connections, short circuits, open circuits, and/or coupled transients.

Sensor integrated circuits are widely used in automobile control systems and other safety critical applications. It is increasingly important for sensor ICs to function properly even in the presence of power disturbances to the extent possible. Preferably, the sensor IC can withstand some level of power disturbances while still providing an accurate output.

One approach to address this problem has been to use a supply line filter, such as a resistor capacitor (RC) filter, that functions to both filter transient disturbances and store energy to power the IC during a power interruption. However, this approach is limited by the size of the passive components, as well as the degradation of supply bandwidth that can be tolerated in the case of a two-wire sensor that communicates its output through the supply lines.

Some sensors contain reset circuitry that causes the sensor, or certain portions of the sensor, to shut down if power to the IC experiences a disturbance of a certain severity (e.g., magnitude and/or duration). If operational interruption is unavoidable due to the extent of the disturbance, then it is important for the IC to restart in the proper state.

SUMMARY

A sensor integrated circuit having a power pin for coupling to an external power supply, a reference pin, and a functional circuit includes an energy storage device having a first terminal coupled to the functional circuit and a blocking circuit coupled between the power pin and the first terminal of the energy storage device and configured to permit the energy storage device to store energy from the external power supply. The first terminal of the energy storage device is inaccessible from outside of the sensor integrated circuit.

Features may include one or more of the following. The energy storage device may include a capacitor having a second terminal coupled to the reference pin. A first regulator may be coupled between the blocking circuit and the first terminal of the capacitor. The first regulator has an input coupled to the power pin and may provide a voltage to the capacitor that is higher than a voltage of the external power supply. Illustrative configurations for the first regulator include a Boost regulator and a charge pump. In an embodiment, the first regulator has an input coupled to the power pin, an output coupled to the first terminal of the capacitor, and includes the blocking circuit.

The sensor integrated circuit may include a second regulator coupled between the first terminal of the energy storage device and the functional circuit. The second regulator may take the form of a linear regulator. The blocking circuit may take the form of a uni-directional switch, such as may include one or more of a diode, a diode-connected transistor, or an active switch. A low power circuit may be provided to cause the functional circuit to enter a low power mode of operation in response to a voltage across the energy storage device and/or a voltage across the power and reference pins.

Also described is a sensor integrated circuit having a power pin for coupling to an external power supply, a reference pin, and a functional circuit, including an energy storage device having a first terminal coupled to the functional circuit and a first regulator having an input coupled to the power pin and an output coupled to the first terminal of the energy storage device, wherein the first regulator provides a voltage higher than a voltage of the external power supply to the capacitor.

Features may include one or more of the following. A blocking circuit may be coupled between the power pin and the first terminal of the energy storage device and configured to permit the energy storage device to store energy from the external power supply and/or the first regulator may include the blocking circuit. The blocking circuit may take the form of a uni-directional switch, such as one or more of a diode, a diode-connected transistor, or an active switch.

The first regulator may take the form of a Boost regulator or a charge pump. A second regulator may be coupled between the first terminal of the energy storage device and the functional circuit. The second regulator may take the form of a linear regulator. A low power circuit may be provided to cause the functional circuit to enter a low power mode of operation in response to a voltage across the energy storage device and/or a voltage across the power and reference pins. The first terminal of the energy storage device may be inaccessible from outside of the integrated circuit. Illustrative energy storage devices include one or more of a capacitor or an inductor.

Also described is a sensor integrated circuit including a lead frame comprising at least two externally accessible leads configured to permit external power and ground connections to the sensor integrated circuit and a capacitor having a first terminal and a second terminal, wherein the first terminal of the capacitor is isolated from the externally accessible leads and the second terminal is coupled to at least one of the externally accessible leads.

Features may include one or more of the following. The lead frame may include an externally inaccessible lead coupled to the first terminal of the capacitor. Each of the at least two externally accessible leads and the externally inaccessible lead may have a respective die attach portion to which a semiconductor die is attached. A non-conductive mold material may enclose the capacitor and the semiconductor die. A second capacitor may be provided with a first terminal and a second terminal coupled between the at least two externally accessible leads.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
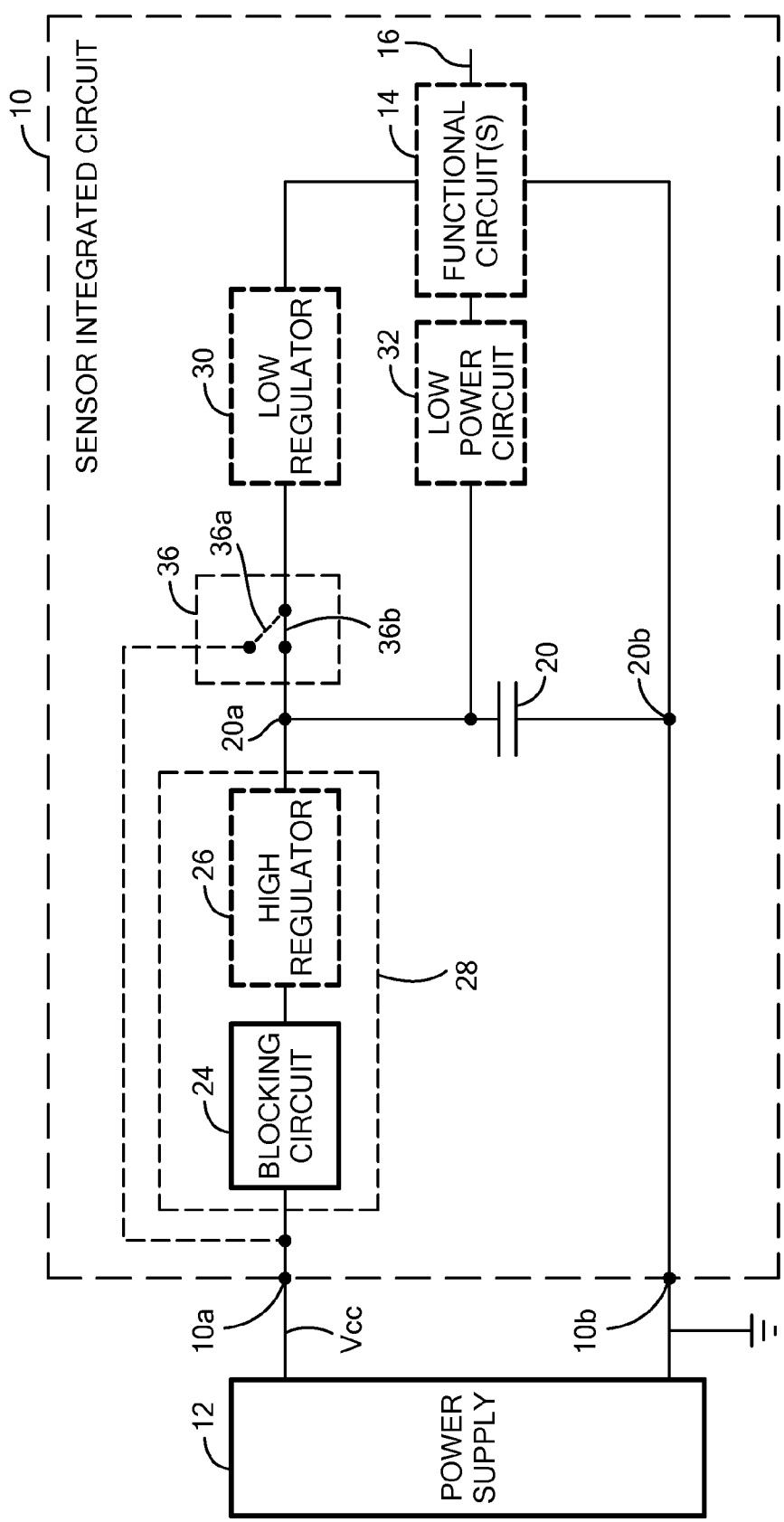
FIG. 1 is a schematic of a sensor integrated circuit including a package capacitor.

Referring to FIG. 1, a sensor integrated circuit (IC) 10 includes a power pin 10a for coupling to an external power supply 12, a reference pin 10b for coupling to an external reference potential (referred to alternatively as a ground pin 10b), and one or more functional circuits 14 (herein referred to simply as functional circuit 14). An energy storage device 20 is provided within the IC 10 in order to filter power to the IC and to store energy for use by the functional circuit 14 as needed under certain conditions.

Figure 6:
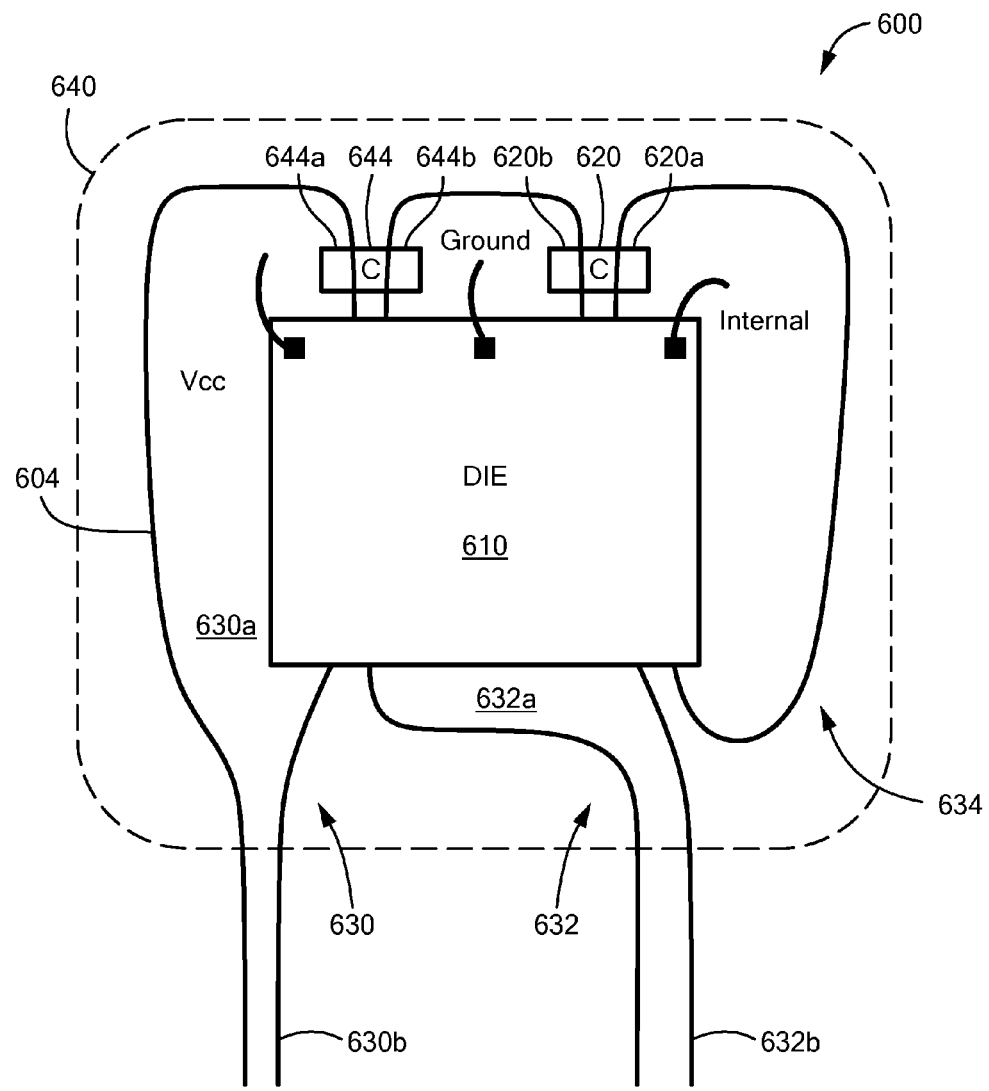
FIG. 6 is a plan view of a sensor integrated circuit package.

The sensor IC 10 generally includes one or more semiconductor die supporting electronic circuitry, a lead frame having a plurality of leads through which certain connections can be made to the IC circuitry from outside of the IC, and may optionally include additional elements, such as discrete components, as is shown in FIG. 6. Portions of the IC, including at least the semiconductor die and a portion of the lead frame, are enclosed by a non-conductive mold material (sometimes referred to as the IC package) while other portions (such as connection portions of leads) extend from the mold material and permit access to connection points within the IC. Here, supply and ground pins 10a, 10b are provided in the form of connection portions of leads and permit access to connection points within the integrated circuit 10. Thus, it will be appreciated that pins 10a, 10b of the IC 10 of FIG. 1 are accessible from outside of the IC while other portions of the IC are not.

The functional circuit 14 is powered by the supply voltage Vcc provided by the external supply 12 coupled to the IC 10 through the power and ground pins 10a, 10b and provides one or more output signal(s) 16 of the sensor 10. Output signal 16 may be provided at a separate dedicated pin or pins of the IC or alternatively, the output 16 may be provided in the form of a current signal on the power and ground signal lines through the power and ground pins 10a, 10b, respectively, in the case of a two-wire IC. In some sensors, additional connection points within the IC are made accessible for testing purposes only (e.g., bond pads of the semiconductor die used for wafer level testing) but are not accessible outside of the IC.

The functional circuit 14 can take any form of electronic sensor circuitry that can be provided in the form of an integrated circuit. One type of functional circuit 14 includes one or more magnetic field sensing elements. Such a magnetic field sensor IC can be used to perform various functions, including, but not limited to, a current sensor that senses a magnetic field generated by a current carried by a conductor, a magnetic switch (also referred to as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Other types of functional circuits are also possible.

According to embodiments, the sensor IC 10 includes one or more features to enable the functional circuit 14 to withstand power disturbances without resetting or losing output accuracy, including the energy storage device 20, a blocking circuit 24, a first, high regulator 26, a second, low regulator 30, and a low power circuit 32. It will be appreciated that these features 20, 24, 26, 30, and 32 can be used alone or in any combination in order to optimize performance of the sensor IC in the presence of power disturbances. With the exception of the blocking circuit 24, the energy storage device 20, and the functional circuit 14, any of the other features of FIG. 1 can be selectively provided or even omitted. An additional switching cell 36 may be provided in certain embodiments as will be described.

The energy storage device 20 can take any suitable form with which power from the external supply 12 can be filtered and/or energy from the external supply can be stored. In the embodiment of FIG. 1, the energy storage device 20 is a capacitor having a first terminal 20a configured to be coupled to the functional circuit 14. For simplicity of discussion, wherever "capacitor" is used herein it will be understood to refer more generally to any suitable energy storage device. Furthermore, it will be appreciated that when a circuit or element is described herein as being "coupled" to another circuit or element, such coupling can be direct or indirect.

Significantly, the first terminal 20a of the capacitor 20 is not coupled to a pin, or lead of the IC and thus, is inaccessible from outside of the IC package. By inaccessible, it is meant that the pin, or lead is not readily connectable to an element or circuit outside of the IC package. It will be appreciated however that an inaccessible pin could have a small portion that extends beyond the package (i.e., the mold material) in certain embodiments, such as those in which the lead is cut back after the mold material is formed. This configuration is advantageous because certain power disturbances, such as inductively coupled transient events, can occur on conductors used to connect the IC 10 to other circuitry within a larger system (e.g., a wiring harness that couples IC pins 10a, 10b to power supply 12 in an automobile). By isolating even a portion of the energy storage device 20 from such external connection points, immunity to power disturbances can be improved.

The second terminal 20b of the capacitor 20 is configured to be coupled to a reference potential. The second terminal 20b can be coupled to the ground pin 10b, as shown. Alternatively, the second terminal 20b could be coupled to a different reference potential and may or may not be accessible from outside of the IC 10. Again, isolating the capacitor 20 from events outside of the IC can improve the immunity of the IC to certain power disturbances.

Figure 1A:
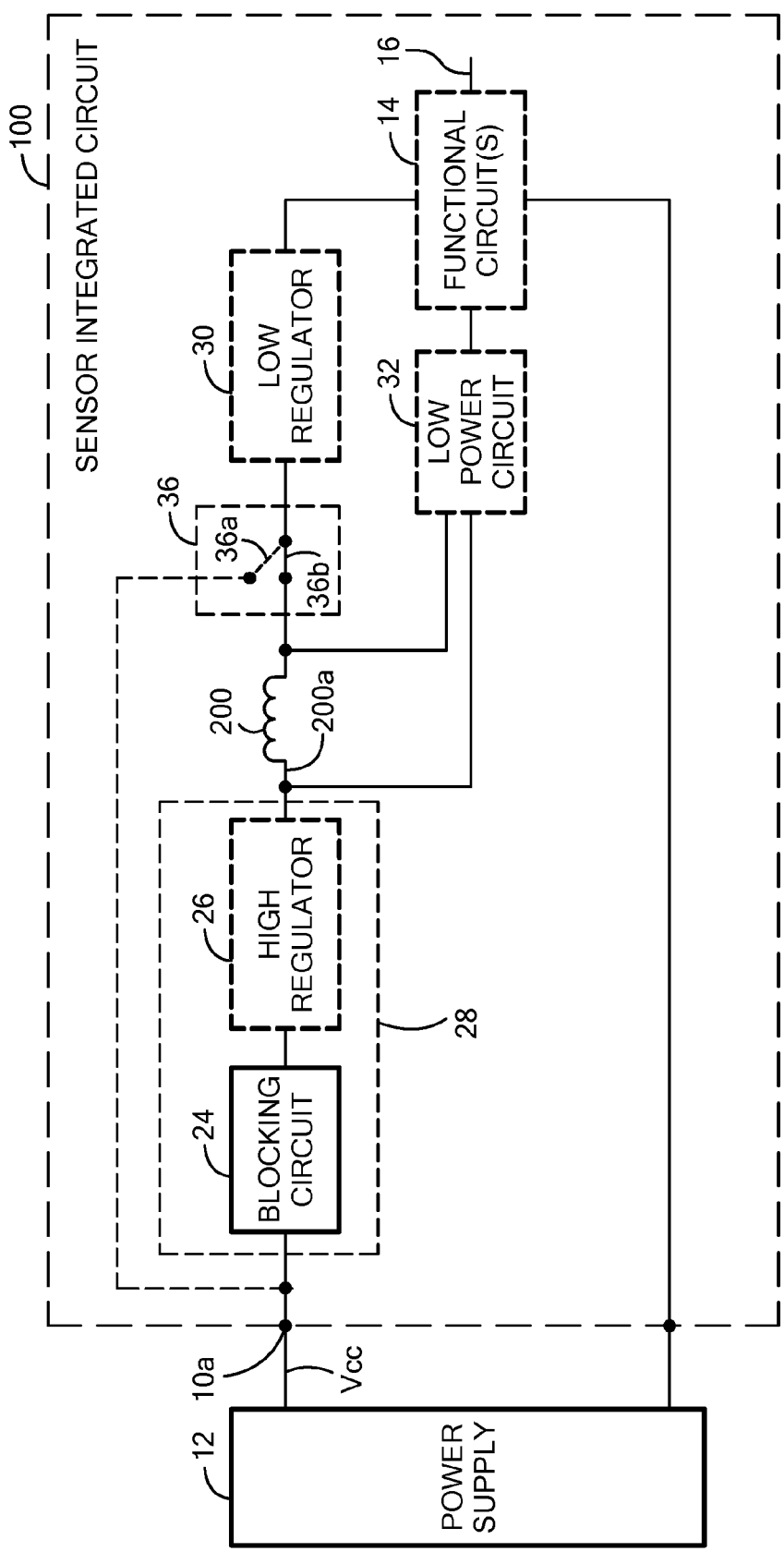
FIG. 1A is a schematic of a sensor integrated circuit including a package inductor.

Referring also to FIG. 1A, an alternative sensor IC 100 is shown to include most of the same elements and features as FIG. 1 with the exception that in IC 100, the energy storage device is provided in the form of an inductor 200 coupled in series between the power supply pin 10a and the functional circuit 14 (rather than in parallel with the power supply and ground pins 10a, 10b, as in the case of the capacitor 20 of FIG. 1).

While a single energy storage device is shown in FIG. 1 in the form of capacitor 20 and a single energy storage device is shown in FIG. 1A in the form of inductor 200, it will be appreciated that more than one energy storage device and even a network of such devices may be used in order to achieve the desired filtering and/or energy storage functionality to suit a particular application.

The blocking circuit 24 is coupled between the power pin 10a and the first terminal 200a of the inductor 200 and is configured to permit the energy storage device 200 to store energy from the external power supply 12. To this end, blocking circuit 24 can be described generally as a unidirectional switch that permits current flow in one direction, here from the power supply 12 to the energy storage device 20, and prevents current flow in the opposite direction, here from the energy storage device to the power supply (or anywhere except to the functional circuit 14).

Figure 2:
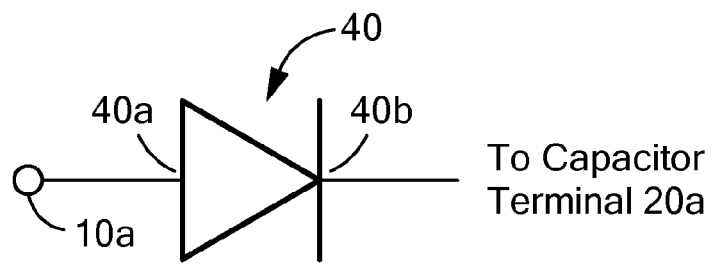
FIG. 2 shows a blocking circuit suitable for the sensor integrated circuit of FIG. 1.
Figure 2A:
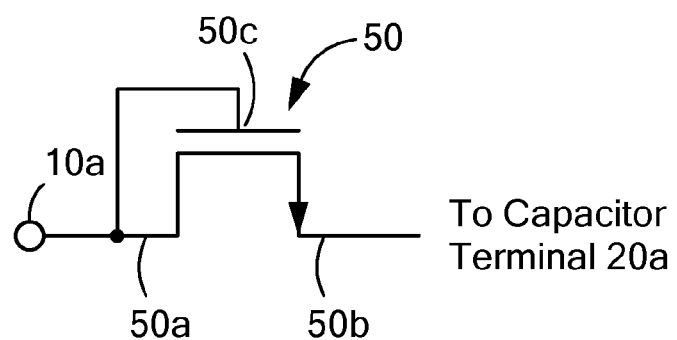
FIG. 2A shows a blocking circuit suitable for the sensor integrated circuit of FIG. 1.

Referring also to FIG. 2, an illustrative blocking circuit 24 can include a diode 40 having an anode 40a coupled to the power supply pin 10a (FIG. 1) and a cathode for coupling to the first terminal 20a of capacitor 20 (FIG. 1). An alternative blocking circuit is shown in FIG. 2A in the form of a diode-connected transistor switch 50, here an NMOS FET switch, having a drain terminal 50a coupled to the power supply pin 10a, a source terminal 50b for coupling to the first terminal 20a of capacitor 20, and a gate terminal 50c coupled to the drain terminal 50a. In this configuration, the threshold voltage of the transistor switch 50 is less than the breakdown of its body diode.

Figure 2B:
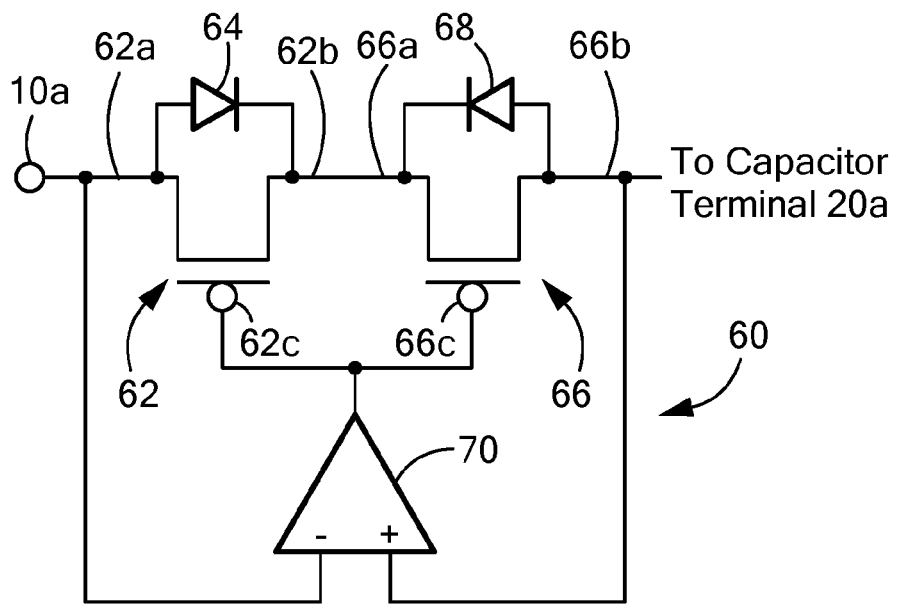
FIG. 2B shows a blocking circuit suitable for the sensor integrated circuit of FIG. 1.

Referring also to FIG. 2B, another suitable blocking circuit is provided in the form of an active switch 60 that includes a first FET 62 having a blocking body diode 64, a second FET 66 having a blocking body diode 68, and a comparator 70. FET 62 is here provided as a PMOS FET having a source terminal 62a coupled to the power supply pin 10a and a drain terminal 62b. FET 66 is also here provided as a PMOS FET and has a source terminal 66a coupled to the drain terminal 62b of FET 62 and a drain terminal 66b for coupling to the first terminal 20a of capacitor 20. The gate terminals 62c, 66c of FETs 62, 66, respectively, are coupled to the output of comparator 70, which comparator has inputs coupled to the source terminal 62a of FET 62 and the drain terminal 66b of FET 66. FET 62 is designed to have its inherent diode from body to drain shorted and FET 66 is designed to have its inherent diode from source to body shorted.

With this configuration, when the supply voltage Vcc is lower than the voltage at the first terminal 20a of the capacitor, the comparator 70 keeps switches 62 and 66 off. With switches 62 and 66 off, body diode 64 prevents current flow from the capacitor 20 to the supply 12. Whereas, when the supply voltage Vcc is greater than the capacitor voltage, comparator 70 turns switches 62 and 66 on, thereby permitting current flow from the supply 12 through FETs 62, 66 to charge the capacitor 20 and ultimately power the functional circuit 14.

It will be appreciated that any suitable element or combination of blocking circuits 40, 50, or 60 may be used to provide the blocking circuit 24 (FIG. 1). Design considerations for the blocking circuit 24 may include size, cost, and forward voltage drop(s). For example, the active switch 60 will generally have a lower voltage drop than the diode 40 or diode-connected switch 50 and will permit tighter control over the switch turn on and turn off; however, additional die space and higher cost may be associated with the active switch than with the other blocking circuit embodiments.

Referring again to FIG. 1, blocking circuit 24 is coupled to the first, high regulator, which regulator 26 is further coupled to the first terminal 20a of the capacitor 20. An input of the regulator 26 is coupled to the power pin 10a through the blocking circuit 24 and an output of the regulator is coupled to the first terminal 20a of the capacitor 20. The high regulator 26 functions to regulate the supply voltage Vcc to within a specified range, generally smaller than the supply voltage range. The high regulator 26 can also improve transient supply rejection.

It will be appreciated that by controlling the maximum voltage to which the capacitor 20 is exposed with the high regulator 26, a lower voltage rated capacitor may be used. For example, the external power supply 12 may be provided by an automobile battery that can range in voltage from 4-24 volts for example. With such a wide range of supply voltage, the capacitor 20 would have to be rated for the highest possible voltage. By limiting the maximum capacitor voltage with the high regulator 26, such as to a maximum voltage of 5 volts as an example, it may be possible to use a higher capacitance and/or lower cost device than otherwise possible.

Figure 3:
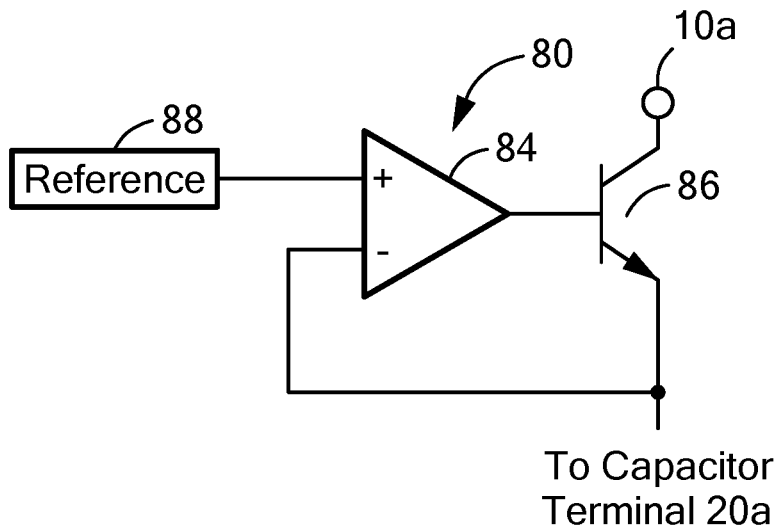
FIG. 3 shows a high or low regulator suitable for the sensor integrated circuit of FIG. 1.

Referring also to FIG. 3, an illustrative regulator for use as the high regulator 26 is provided in the form of a linear regulator 80, including an amplifier 84, a transistor 86, and a reference source 88. The transistor 86 is coupled in series between the power supply pin 10a and the first terminal 20a of the capacitor. Amplifier 84 provides a control input signal to the transistor 86 in order to maintain conduction of the transistor sufficient to regulate the voltage provided to the capacitor 20 to a desired level based on a reference voltage 88.

In some embodiments, the high regulator 26 provides a voltage to the capacitor 20 that is higher than the supply voltage Vcc. Thus, in such embodiments, the regulator 26 functions to boost the power supply voltage to provide a higher voltage to the capacitor 20 in order to thereby increase the energy otherwise stored on the capacitor.

Figure 3A:
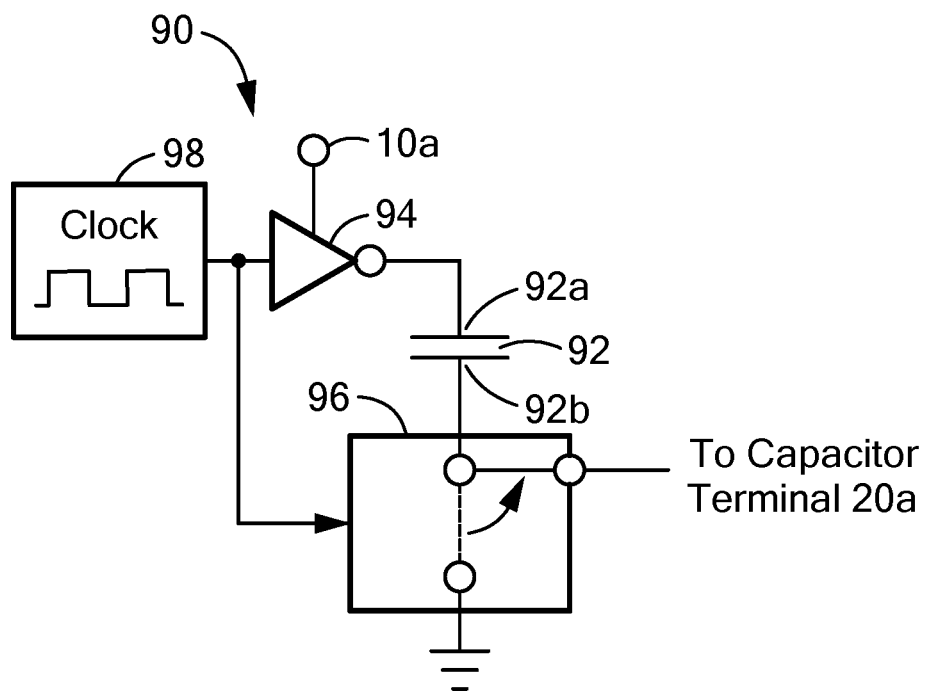
FIG. 3A shows a high regulator suitable for the sensor integrated circuit of FIG. 1.

Referring to FIG. 3A, one such high regulator that effectively boosts the supply voltage to provide a higher voltage to the capacitor 20 is shown in the form of a charge pump 90. The charge pump 90 includes a capacitor 92 that has a first terminal 92a coupled to an output of an inverting amplifier 94 powered by the supply voltage Vcc at pin 10a and a second terminal 92b that is selectively coupled, through a switch 96, either to ground or to the first terminal 20a of capacitor 20 under the control of a clock signal provided by a clock circuit 98, as shown. Initially, the charge pump capacitor 92 is coupled to the first terminal 20a of capacitor 20 to charge the capacitor to a level associated with the capacitance values of the two capacitors 92, 20. Thereafter, the charge pump capacitor 92 is coupled between the inverter 94 and ground to charge the capacitor 92 to the supply voltage level Vcc. When the charge pump capacitor 92 is then coupled to the first terminal 20a of capacitor 20, the voltage at the capacitor terminal 20a is effectively increased by the supply voltage level Vcc. With this arrangement, the charge pump 90 effectively boosts the voltage level to which the capacitor 20 is charged.

Figure 3B:
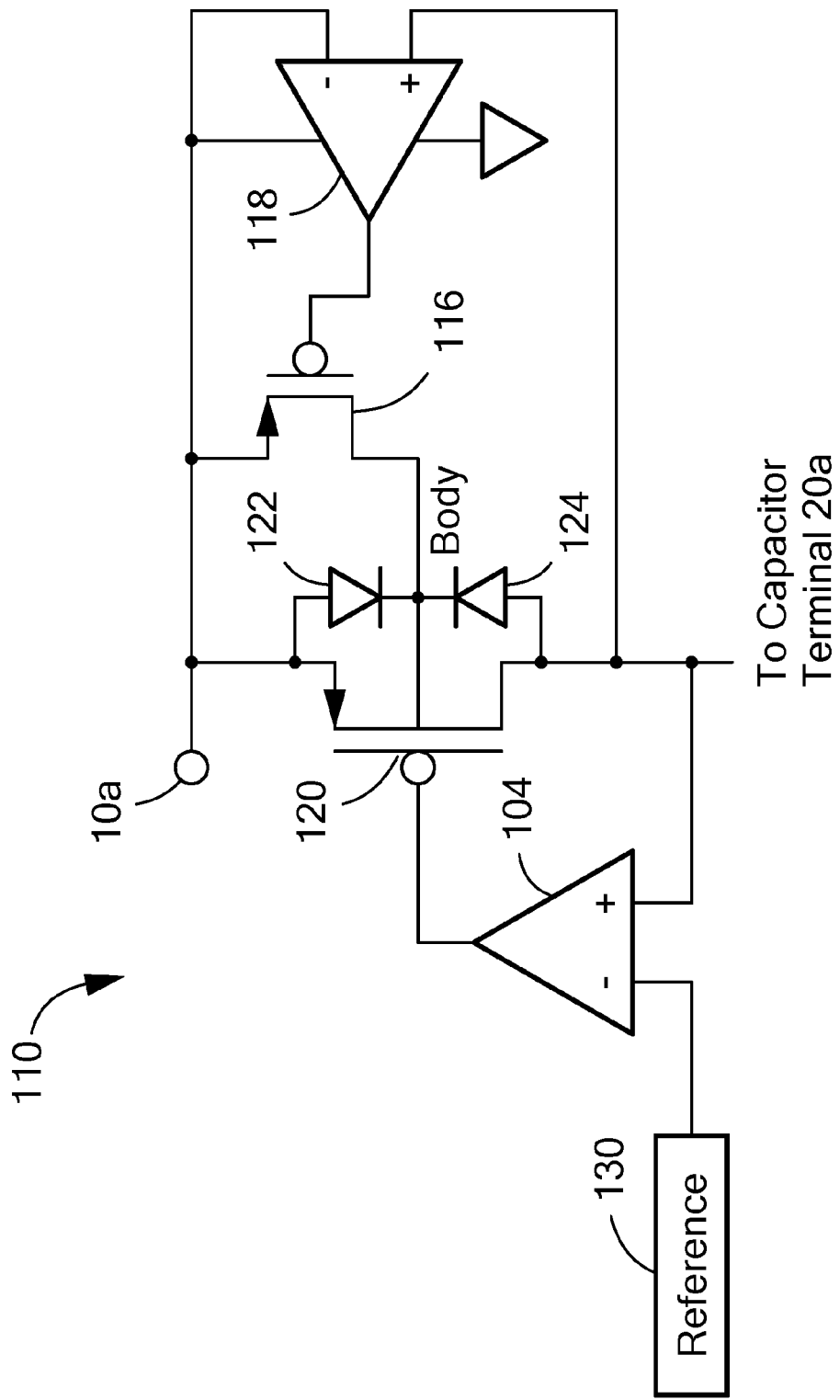
FIG. 3B shows a high regulator suitable for the sensor integrated circuit of FIG. 1.

Referring again to FIG. 1, in some applications, it may be desirable to combine the blocking circuit functionality with the high regulator functionality in a combined circuit 28. FIG. 3B shows one example circuit 110 of such a combined blocking circuit and high regulator. Circuit 110 includes a comparator 104 that controls conduction of a switch 120 coupled in series between the supply pin 10a and the first terminal 20a of the capacitor. In the embodiment of FIG. 3B, the switch 120 is provided in the form of a PMOS switch having a source terminal coupled to the supply pin 10a, a drain terminal coupled to the capacitor terminal 20a, and back-to-back body diodes 122, 124 with cathodes at the body region of the switch, as shown.

More particularly, the comparator 104 compares a reference voltage 130 to the voltage at capacitor terminal 20a and causes the switch 120 to turn on when the capacitor voltage falls to a predetermined level established by the reference 130 so as to allow current to flow through the switch 120 to charge the capacitor 20. With these voltage conditions, current will not flow from the capacitor 20 to the supply 12, so blocking current flow from the capacitor 20 is not an issue. However, when the supply voltage becomes less than the predetermined level, even though the comparator 104 will turn off the switch 120, it is necessary to block any current path from the capacitor 20 to the supply. To this end, it is necessary to control the voltage at the body region of the switch 120 as is here achieved with an additional switch 116 and a comparator 118 having its body region coupled to its drain terminal. In particular, when the supply voltage falls to below the capacitor voltage, the comparator 118 turns off PMOS switch 116, thereby disconnecting the body region of switch 120 from Vcc. With this voltage condition, diode 122 will block any current flow from the capacitor 20 to the supply. It will be appreciated that switch 120 alternatively may be operated in its linear region. It will be appreciated that when the capacitor 20 is being charged (i.e., switch 120 is on), if the supply voltage were to dip, current flow from the capacitor to the supply can be prevented by incorporating the output of comparator 118 into the comparison by comparator 104. For example, a logic arrangement could be used to prevent the output of comparator 104 from going low to pull the gate of switch 120 low when the output of comparator 118 is high.

It will be appreciated that the illustrative high regulators of FIGS. 3, 3A, and 3B are examples only that that various other types of regulators are possible in order to control the capacitor voltage and thus, the energy stored on the capacitor. For example, in certain applications it may be desirable to use a switching or switch-mode regulator or a Boost or a Buck regulator.

Referring again to FIG. 1, the low regulator 30 is coupled between the high regulator 26 and the functional circuit (or optionally between the switch 36 and the functional circuit 14, as will be described). The low regulator 30 functions to provide a substantially constant voltage to the functional circuit 14 even in the presence of disturbances in the power supply voltage Vcc or even the voltage on the capacitor 20.

The low regulator 30 may be provided in the form of a linear regulator, as may be the same as or similar to the regulator 80 of FIG. 3. It will be appreciated that other types of regulators and topologies are possible for the low regulator.

The low power circuit 32 detects the capacitor voltage (or the inductor voltage in the case of FIG. 1A) and/or the voltage across the power and reference pins and, upon detection of a low or decreasing voltage, causes the functional circuit 14 to enter a low power mode of operation. Once a low or decreasing energy storage voltage is detected, various low power actions can be taken. For example, in some applications, the functional circuit 14 includes analog circuit portions and digital circuit portions and the analog circuit portions may be shut down and the states of the digital circuitry may be stored in order to reduce power consumption (i.e., the current draw by the functional circuit 14) and ensure an accurate restart once the energy storage device is charged to a predetermined level.

Additional circuits and techniques for low power operation are described in U.S. Pat. No. 8,008,908, entitled "Low Power Magnetic Field Sensor", issued on Aug. 30, 2011, in U.S. Pat. No. 8,222,888, entitled "Micro-Power Magnetic Switch", issued on Jul. 17, 2012, and in U.S. Patent Application publication No. 2013/0176012 A1 entitled "Methods and Apparatus for Supply Voltage Transient Protection" filed on Jul. 11, 2013, all of which are assigned to the assignee of the subject application and incorporated herein by reference in their entirety.

Switch 36 may be coupled between the high regulator 26 (or combined high regulator and blocking circuit 28) and the low regulator 30, as shown. Generally, power supply disturbances are relatively short duration events. In some applications, it may be desirable to keep switch 36 in the position 36a (illustrated by a dotted line) in which power supply pin 10a is directly coupled to the low regulator 30 during normal operation and to toggle the switch to position 36b (illustrated by a solid line) in which the power supply pin 10a is coupled to the capacitor 20 only in response to detection of a power disturbance of a predetermined duration and/or magnitude. For example, in one embodiment, the Vcc voltage and the capacitor voltage can be measured and compared and the switch 36 can couple the higher of the two voltages to the low regulator 30. By using switch 36 in this fashion, during normal operation, the IC would draw operational current directly from the supply pin 10a while a relatively weak and low cost charge pump can be used as the high regulator 26 to trickle charge to the capacitor 20 to charge the capacitor a desired voltage level. Then, when a low voltage condition is detected on the supply pin 10a, the switch 36 could be toggled to temporarily pull current from the capacitor 20.

Figure 4:
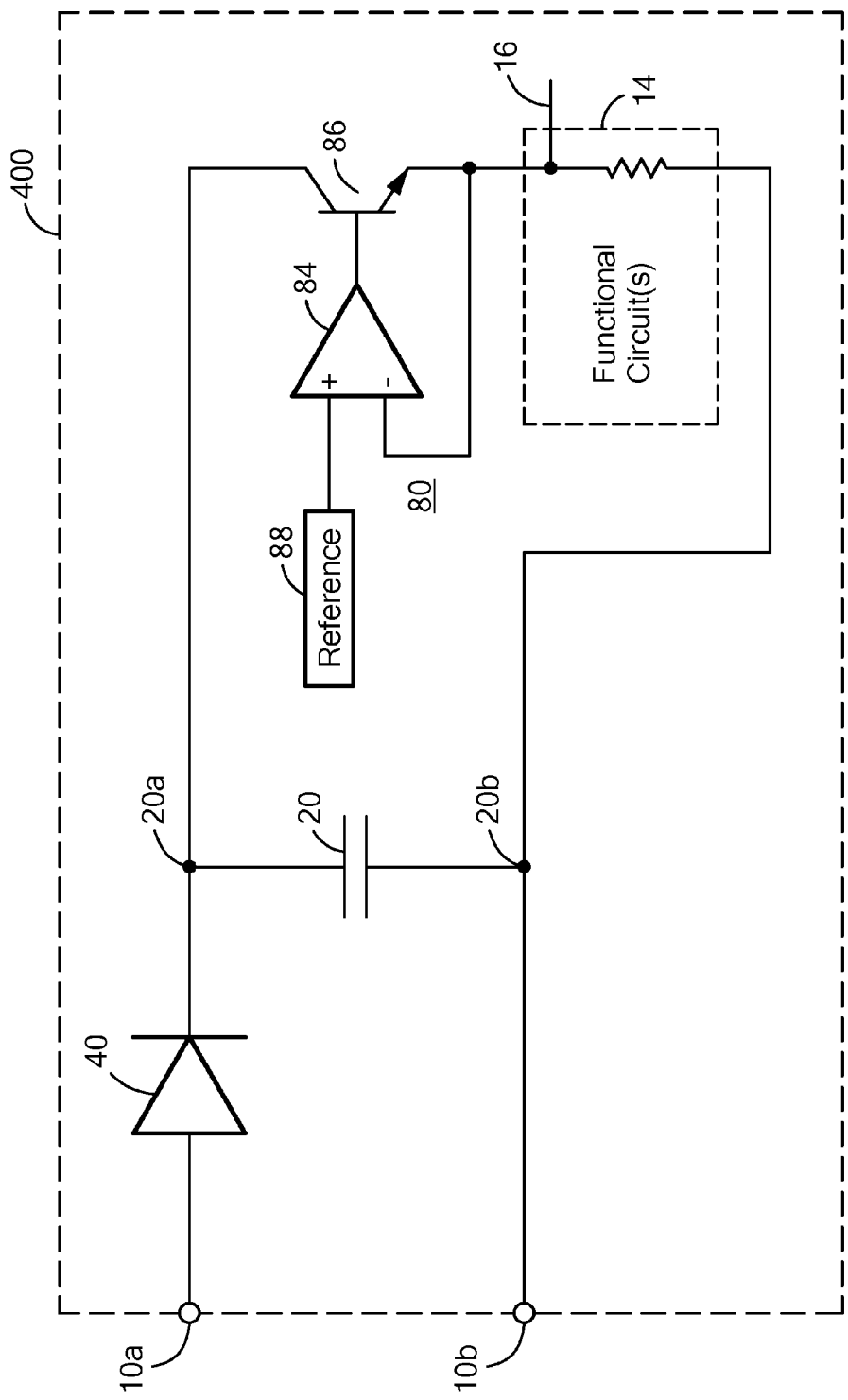
FIG. 4 is a schematic of a sensor integrated circuit embodiment.

Referring to FIG. 4, an illustrative sensor IC 400 of the general type shown in FIG. 1 includes power pin 10a for coupling to an external power supply (such as supply 12 in FIG. 1), reference pin 10b for coupling to an external reference potential, functional circuit 14, an energy storage device in the form of capacitor 20, and a blocking circuit in the form of a diode 40 (FIG. 2). A first terminal 20a of the capacitor is coupled between the blocking diode 40 and a low regulator, here in the form of a linear regulator 80 (FIG. 3A) including amplifier 84, reference 88, and pass element 86. As shown, the first terminal 20c of the capacitor 20 is inaccessible from outside of the sensor integrated circuit 400.

Figure 5:
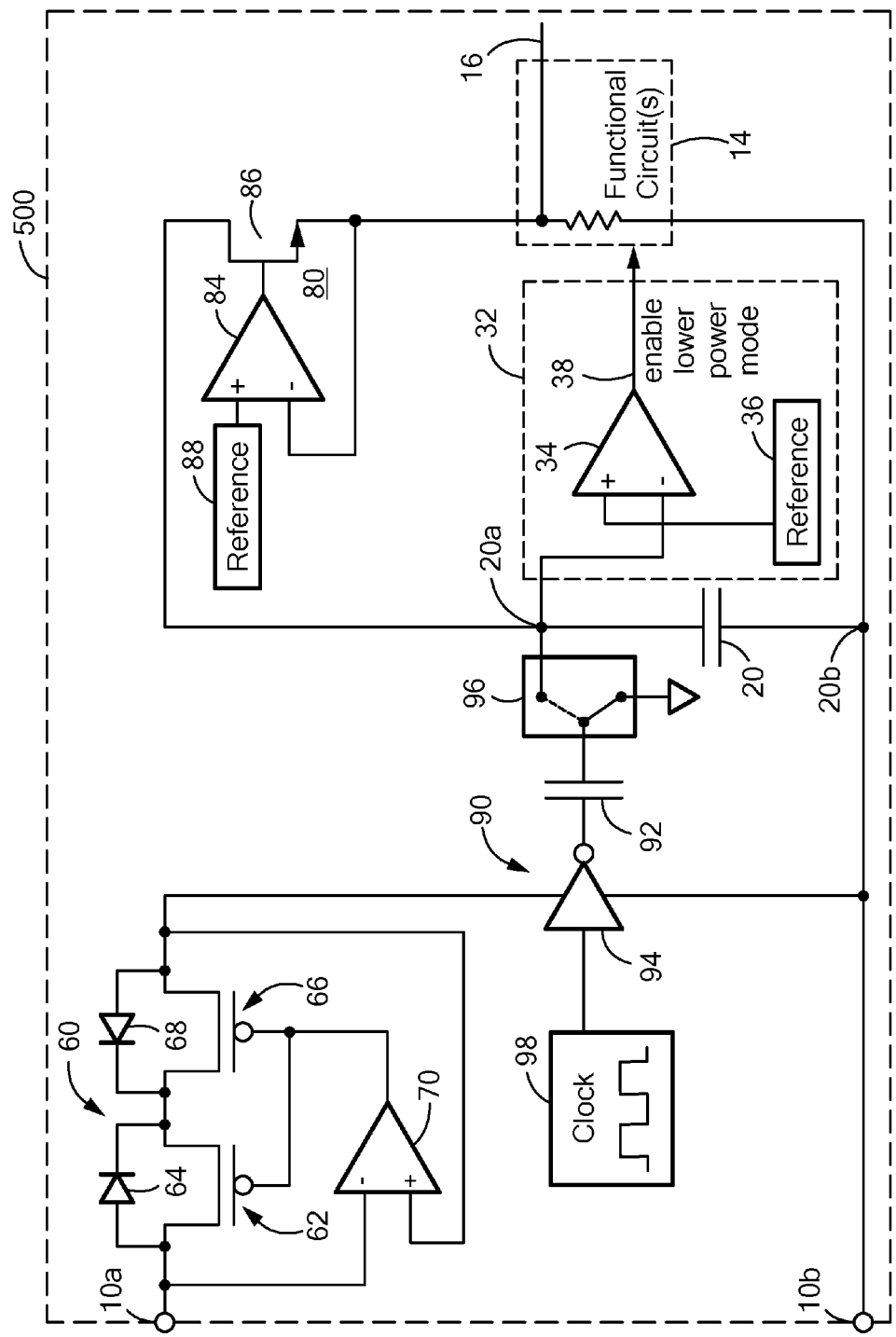
FIG. 5 is a schematic of an alternative sensor integrated circuit embodiment.

Referring to FIG. 5, an alternative sensor IC 500 of the general type shown in FIG. 1 includes power pin 10a for coupling to an external power supply, reference pin 10b, functional circuit 14, an energy storage device in the form of capacitor 20, and a blocking circuit in the form of an active switch 60 (FIG. 2B). A high regulator in the form of a charge pump 90 (FIG. 3A) is coupled between the active switch 60 and the first terminal 20a of capacitor 20. The first terminal 20a of the capacitor 20 is further coupled to a low regulator, in the form of a linear regulator 80 (FIG. 3A) including amplifier 84, reference 88, and pass element 86. As shown, the first terminal 20a of the capacitor 20 is inaccessible from outside of the sensor integrated circuit 500.

A low power circuit 32 is coupled between the first terminal 20a of capacitor 20 and includes a comparator 34 configured to compare the capacitor voltage to a reference voltage 36 and provide an enable output signal 38 for coupling to the functional circuit 14 to enable a lower power mode of operation if the capacitor voltage falls to a predetermined level.

It will be appreciated that FIGS. 4 and 5 are two of many examples of combinations of the various suitable circuits and circuit elements to provide features of the sensor IC as described herein.

Referring to FIG. 6, a sensor IC 600 includes a lead frame 604, a semiconductor die 610, and an energy storage device 620, here in the form of a discrete capacitor. Lead frame 604 includes a plurality of leads 630, 632, and 634, at least two of which (here leads 630 and 632) are externally accessible from outside of the IC 600 and which are configured to permit external power and ground connections to be made to the IC. The capacitor 620 has a first terminal 620a that is isolated from the externally accessible leads 630, 632 and a second terminal 620b coupled to at least one of the externally accessible leads, here to lead 632. An externally inaccessible lead 634 of the lead frame 604 is coupled to the first capacitor terminal 620a, as shown.

Each of the externally accessible leads 630, 632 has a respective die attach portion 630a, 632a and connection portion 630b, 632b extending from the respective die attach portion, as shown. The connection portions 630b, 632b of the leads 630, 632 are configured to permit external connections to be made to circuitry internal to the IC package. The semiconductor die 610 is attached, such as with a non-conductive adhesive, to the die attach portions 630a, 632a. The externally inaccessible lead 634 may also have a die attach portion to which the semiconductor die 610 is attached, as shown.

A non-conductive mold material 640 encloses a portion of the lead frame 604, the capacitor 620, and the semiconductor die 610 to form the packaged IC 600. In some embodiments, additional discrete circuit elements, such as a second capacitor 644, or additional semiconductor die (not shown) may also be provided within the IC package 640. In this example, the second capacitor 644 has a first terminal 644a and a second terminal 644b coupled between the at least two externally accessible leads 630, 632.

As noted above, an inaccessible lead is one that is not accessible from outside of the IC package 640 and/or is not readily connectable to an element or component outside of the IC package even though it may extend very slightly outside of the package. For example, in some embodiments, during manufacture of the lead frame 604, inaccessible lead 634 would take the same general form as leads 630 and 632 for ease of manufacture, but at a later stage of manufacture, inaccessible lead 634 could be cut back to approximately the edge of the package 640. In this situation, while a very small portion of the lead would be exposed from outside of the package 640 it would not be suitable for connection to an external component.

Additional aspects of the discrete capacitor 620 in the IC package are shown and described in U.S. Pat. No. 9,228,860, issued on Jan. 1, 2016, and entitled "Methods and Apparatus for Passive Attachment of Components for Integrated Circuits".

It will be appreciated that although capacitor 620 is shown in the form of a discrete element, the energy storage device may alternatively be formed on the semiconductor die. Illustrative such capacitors are shown and described in U.S. Patent Application Publication No. 2010/0052424 A1, entitled "Methods and Apparatus for Integrated Circuit Having Integrated Energy Storage Device" and in U.S. Pat. No. 7,687,882, entitled "Methods And Apparatus For Integrated Circuit Having Multiple Dies With At Least One On Chip Capacitor", both of which are assigned to the assignee of the subject application and incorporated herein by reference in their entirety.

The sensor IC 600 may include additional features, such as lead frame slots, molded or separately formed hard and/or soft ferromagnetic elements, one or more passive components in series (i.e., "in-line") with a single lead frame lead, one or more passive components coupled across the connection portions of more than one lead, etc. Such features are described in U.S. Patent Application Publication Nos. 2013/0249544 A1 entitled "Magnetic Field Sensor Integrated Circuit with Integral Ferromagnetic Material", 2013/0249029 A1 entitled "Magnetic Field Sensor Integrated Circuit with Integral Ferromagnetic Material", 2013/0249546 A1 entitled "Integrated Circuit Package having a Split Lead Frame", 2013/0249027 A1 "Integrated Circuit Package having a Split Lead Frame", and U.S. Pat. No. 9,411,025, issued on Aug. 9, 2016 and entitled "Integrated Circuit Package having a Split Lead Frame and a Magnet", all of which are assigned to the Assignee of the subject application and hereby incorporated herein by reference in its entirety.

All references cited herein are hereby incorporated herein by reference in their entirety.

Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor integrated circuit having a power pin for coupling to an external power supply, a reference pin, and a functional circuit, comprising:
   an energy storage device having a first terminal coupled to the functional circuit;
   a blocking circuit coupled between the power pin and the first terminal of the energy storage device and configured to permit the energy storage device to store energy from the external power supply, wherein the first terminal of the energy storage device is inaccessible from outside of the sensor integrated circuit;
   a first regulator coupled between the blocking circuit and the first terminal of the energy storage device;
   a low power circuit responsive to a voltage across the energy storage device, a voltage across the power and reference pins, or both to cause the functional circuit to enter a low power mode of operation in which analog circuit portions are shut down and states of digital circuit portions are stored in order to reduce power consumption; and
   a lead frame that supports a semiconductor die and has a plurality of leads including at least a first lead for coupling to the external power supply and a second lead for coupling to the reference pin, and a third lead coupled between the energy storage device and the functional circuit, wherein the third lead is inaccessible from outside of the sensor integrated circuit;
   wherein the blocking circuit and the functional circuit are supported by the semiconductor die, and wherein the energy storage device is external to the semiconductor die.

2. The sensor integrated circuit of claim 1 wherein the energy storage device comprises a capacitor having a second terminal coupled to the reference pin.

3. The sensor integrated circuit of claim 2 wherein the first regulator has an input coupled to the power pin and provides a voltage to the capacitor that is higher than a voltage of the external power supply.

4. The sensor integrated circuit of claim 3 wherein the first regulator comprises a Boost regulator or a charge pump.

5. The sensor integrated circuit of claim 2, the first regulator having an input coupled to the power pin, an output coupled to the first terminal of the capacitor, wherein the first regulator comprises the blocking circuit.

6. The sensor integrated circuit of claim 5 wherein the first regulator has an input coupled to the power pin and provides a voltage to the capacitor that is higher than a voltage of the external power supply.

7. The sensor integrated circuit of claim 6 wherein the first regulator comprises a Boost regulator or a charge pump.

8. The sensor integrated circuit of claim 1 further comprising a second regulator coupled between the first terminal of the energy storage device and the functional circuit.

9. The sensor integrated circuit of claim 8 wherein the second regulator comprises a linear regulator.

10. The sensor integrated circuit of claim 1 wherein the blocking circuit comprises a uni-directional switch.

11. The sensor integrated circuit of claim 10 wherein the blocking circuit comprises one or more of a diode, a diode-connected transistor, or an active switch.

12. The sensor integrated circuit of claim 1, wherein the energy storage device has a second terminal that is coupled to the functional circuit.

13. The sensor integrated circuit of claim 12, wherein the second terminal is coupled to a second reference potential, different than the reference pin to which the second lead is coupled.

14. A sensor integrated circuit having a power pin for coupling to an external power supply, a reference pin, and a functional circuit, comprising:
   an energy storage device having a first terminal coupled to the functional circuit;
   a first regulator having an input coupled to the power pin and an output coupled to the first terminal of the energy storage device, wherein the first regulator provides a voltage higher than a voltage of the external power supply to the energy storage device;
   a blocking circuit coupled between the power pin and the input of the first regulator and configured to permit the energy storage device to store energy from the external power supply;
   a low power circuit responsive to a voltage across the energy storage device, a voltage across the rower and reference pins, or both to cause the functional circuit to enter a low power mode of operation in which analog circuit portions are shut down and states of digital circuit portions are stored in order to reduce power consumption; and
   a lead frame that supports a semiconductor die and has a plurality of leads including at least a first lead for coupling to the external power supply and a second lead for coupling to the reference pin, and a third lead coupled between the energy storage device and the functional circuit, wherein the third lead is inaccessible from outside of the sensor integrated circuit;
   wherein the functional circuit and the first regulator are supported by the semiconductor die, and wherein the energy storage device is external to the semiconductor die.

15. The sensor integrated circuit of claim 14 wherein the blocking circuit comprises a uni-directional switch.

16. The sensor integrated circuit of claim 15 wherein the blocking circuit comprises one or more of a diode, a diode-connected transistor, or an active switch.

17. The sensor integrated circuit of claim 14 wherein the first regulator comprises a Boost regulator or a charge pump.

18. The sensor integrated circuit of claim 14 further comprising a second regulator coupled between the first terminal of the energy storage device and the functional circuit.

19. The sensor integrated circuit of claim 18, wherein the second regulator comprises a linear regulator.

20. The sensor integrated circuit of claim 14 wherein the first terminal of the energy storage device is inaccessible from outside of the integrated circuit.

21. The sensor integrated circuit of claim 14 wherein the energy storage device comprises one or more of a capacitor or an inductor.

22. A sensor integrated circuit having a power pin for coupling to an external power supply, a reference pin, and a functional circuit, comprising:
   a capacitor having a first terminal coupled to the functional circuit, wherein the first terminal is inaccessible from outside of the integrated circuit and further comprising a second terminal coupled to the reference pin;
   a functional circuit;
   a blocking circuit coupled between the power pin and the first terminal of the capacitor and configured to permit the capacitor to store energy from the external power supply;

a first regulator coupled between the blocking circuit and the first terminal of the capacitor;

a second regulator coupled between the first terminal of the capacitor and the functional circuit;

a low power circuit responsive to a voltage across the capacitor, a voltage across the power and reference pins, or both to cause the functional circuit to enter a low power mode of operation in which analog circuit portions are shut down and states of digital circuit portions are stored in order to reduce power consumption; and a lead frame that supports a semiconductor die and has a plurality of leads including at least a first lead for coupling to the external power supply and a second lead for coupling to the reference pin;

wherein the blocking circuit and the functional circuit are supported by the semiconductor die, and wherein the capacitor is external to the semiconductor die.

23. The sensor integrated circuit of claim 22 wherein the first regulator provides a voltage to the capacitor that is higher than a voltage of the external power supply.

24. The sensor integrated circuit of claim 23 wherein the first regulator comprises a Boost regulator or a charge pump.

25. The sensor integrated circuit of claim 22 wherein the second regulator comprises a linear regulator.

26. The sensor integrated circuit of claim 22 wherein the blocking circuit comprises a uni-directional switch.

27. The sensor integrated circuit of claim 26 wherein the blocking circuit comprises one or more of a diode, a diode-connected transistor, or an active switch.

28. The sensor integrated circuit of claim 22, wherein the low power circuit is responsive to a voltage across the capacitor.

29. The sensor integrated circuit of claim 22, wherein the low power circuit is responsive to a voltage across the capacitor and responsive to a voltage across the power and reference pins.

30. A sensor integrated circuit having a power pin for coupling to an external power supply, a reference pin, and a functional circuit, comprising:

a lead frame comprising at least two externally accessible leads configured to permit the external power supply and ground connections to the sensor integrated circuit, the lead frame supporting a semiconductor die and having a plurality of leads including at least a first lead for coupling to the external power supply and a second lead for coupling to the reference pin, wherein each of the at least two externally accessible leads has a respective die attach portion to which the semiconductor die is attached;

a capacitor having a first terminal and a second terminal, wherein the first terminal of the capacitor is isolated from the externally accessible leads and the second terminal is coupled to at least one of the externally accessible leads;

a blocking circuit coupled between the power pin and the first terminal of the capacitor and configured to permit the capacitor to store energy from the external power supply;

a first regulator coupled between the blocking circuit a rid the first terminal of the capacitor;

a low power circuit responsive to a voltage across the capacitor, a voltage across the power and reference pins, or both to cause the functional circuit to enter a low power mode of operation in which analog circuit portions are shut down and states of digital circuit portions are stored in order to reduce power consumption; and a non-conductive mold material enclosing the capacitor, the blocking circuit, the functional circuit, and the semiconductor die;

wherein the capacitor is external to the semiconductor die, wherein the lead frame comprises a third lead coupled between the capacitor and the functional circuit, wherein the third lead is inaccessible from outside of the sensor integrated circuit.

31. The sensor integrated circuit of claim 30 wherein the lead frame comprises an externally inaccessible lead coupled to the first terminal of the capacitor.

32. The sensor integrated circuit of claim 30 further comprising a second capacitor having a first terminal and a second terminal coupled between the at least two externally accessible leads.

* * * * *

UNITED STATES PATENT AND TRADEMARK OFFICE
CERTIFICATE OF CORRECTION

PATENT NO. : 10,411,498 B2
APPLICATION NO. : 15/269097
DATED : September 10, 2019
INVENTOR(S) : Eric G. Shoemaker et al.

It is certified that error appears in the above-identified patent and that said Letters Patent is hereby corrected as shown below:

In the Specification

Column 1, Line 31 delete "or magnetic" and replace with --or more magnetic--.

Column 8, Line 9 delete "that that" and replace with --and that--.

Column 9, Line 17 delete "20c" and replace with --20a--.

Column 10, Line 53 delete "A1 "Integrated" and replace with --A1 entitled "Integrated--.

In the Claims

Column 12, Line 20 Claim 14, delete "rower" and replace with --power--.

Column 14, Line 18 Claim 30, delete "circuit a rid" and replace with --circuit and--.

Signed and Sealed this
Ninth Day of April, 2024

Katherine Kelly Vidal
*Director of the United States Patent and Trademark Office*